(12) United States Patent
Hill

(10) Patent No.: US 6,891,624 B2
(45) Date of Patent: May 10, 2005

(54) CYCLIC ERROR REDUCTION IN AVERAGE INTERFEROMETRIC POSITION MEASUREMENTS

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 438 days.

(21) Appl. No.: 10/097,365

(22) Filed: Mar. 13, 2002

(65) Prior Publication Data

US 2002/0171844 A1 Nov. 21, 2002

Related U.S. Application Data

(60) Provisional application No. 60/275,599, filed on Mar. 13, 2001.

(51) Int. Cl.[7] ................................................ G01B 9/02
(52) U.S. Cl. ...................................................... 356/500
(58) Field of Search ................................ 356/500, 498, 356/496, 486, 490, 508, 510

(56) References Cited

U.S. PATENT DOCUMENTS

| | | | |
|---|---|---|---|
| 4,948,254 A | | 8/1990 | Ishida |
| 5,151,749 A | | 9/1992 | Tanimoto et al. |
| 5,249,016 A | * | 9/1993 | Tanaka .......................... 355/53 |
| 5,331,400 A | | 7/1994 | Wilkening et al. |
| 5,404,222 A | | 4/1995 | Lis |
| 5,432,603 A | * | 7/1995 | Sentoku et al. .............. 356/490 |

(Continued)

FOREIGN PATENT DOCUMENTS

| | | |
|---|---|---|
| JP | 351078 | 12/1995 |
| JP | 117083 | 4/1996 |
| JP | 10-260009 | 9/1998 |

OTHER PUBLICATIONS

Badami V.G. et al., "Investigation of Nonlinearity in High Accuracy Heterodyne Laser Interferometry," 1997 Proceedings, vol. 16, pp. 153–156.
Wu, C.M. et al., "Analytical Modeling of the Periodic Nonlinearity in Heterodyne Interferometry," Applied Optics, vol. 37, No. 28, Oct. 1, 1998, pp. 6696–6700.
Oka K. et al., "Polarization Heterodyne Interferometry Using Another Local Oscillator Beam," Optics Communications, 92 (1992), 1–5.

(Continued)

*Primary Examiner*—Andrew H. Lee
(74) *Attorney, Agent, or Firm*—Fish & Richardson P.C.

(57) ABSTRACT

The invention features a system and method for reducing the contribution of cyclic errors to an interferometric position measurement of a movable stage. An initial interferometric position measurement of the stage is averaged with at least one additional measurement corresponding to a displacement(s) of the stage from its initial position. The displacements are selected to reduce the overall cyclic error contribution to an average position measurement. As a result, the average position of the stage can be measured more accurately than any of its individual positions. The average position can be used to more accurately determine the average position of an alignment mark on a wafer carried by the stage. Furthermore, the averaging described above can be applied to additional interferometric measurement axes. For example, the averaging can be applied to two laterally displacement measurement axes that are substantially parallel to one another to more accurately determine an average angular orientation of the stage. The result can be used to more correctly determine an Abbe offset error in the average position of an off-axis alignment mark (i.e., an alignment mark that is not aligned with one of the interferometric measurement axes).

43 Claims, 7 Drawing Sheets

U.S. PATENT DOCUMENTS

| | | |
|---|---|---|
| 5,483,343 A | 1/1996 | Iwamoto et al. |
| 5,491,550 A | 2/1996 | Dabbs |
| 5,663,793 A | 9/1997 | de Groot |
| 5,724,136 A | 3/1998 | Zanoni |
| 5,757,160 A | 5/1998 | Dreuzer |
| 5,764,361 A | 6/1998 | Kato et al. |
| 5,790,253 A | 8/1998 | Kamiya |
| 5,850,291 A * | 12/1998 | Tsutsui ........................ 356/400 |
| 6,008,902 A | 12/1999 | Rinn |
| 6,020,964 A | 2/2000 | Loopstra et al. |
| 6,046,792 A | 4/2000 | Van Der Werf et al. |
| 6,134,007 A | 10/2000 | Naraki et al. |
| 6,137,574 A | 10/2000 | Hill |
| 6,160,619 A | 12/2000 | Magome |
| 6,181,420 B1 | 1/2001 | Badami et al. |
| 6,201,609 B1 | 3/2001 | Hill et al. |
| 6,246,481 B1 | 6/2001 | Hill |
| 6,252,668 B1 | 6/2001 | Hill |
| 6,271,923 B1 | 8/2001 | Hill |
| 6,304,318 B1 | 10/2001 | Matsumoto |
| 6,313,918 B1 | 11/2001 | Hill et al. |
| 6,687,013 B2 * | 2/2004 | Isshiki et al. ............... 356/498 |
| 2002/0089671 A1 | 7/2002 | Hill |

OTHER PUBLICATIONS

Hines, B. et al., "Sub–Nanometer Laser Metrology—Some Techniques and Models," Jet Propulsion Laboratory, California Institute of Technology, pp. 1195–1204.

Bobroff, N., "Recent Advances in Displacement Measuring Interferometry," Measurement Science & Technology, vol. 4, No. 9, Sep. 1993, pp. 907–926.

Bennett, S.J. *Optics Communications,* 4:6, pp. 428–430, 1972.

Isshiki et al., U.S. Appl. No. 2002/0048026 A1, Published Apr. 25, 2002, entitled "Laser Interferometer Displacement Measuring System, Exposure Apparatus, and Elecron Beam Lithography Apparatus".

* cited by examiner

CYCLIC ERROR REDUCTION IN AVERAGE INTERFEROMETRIC POSITION MEASUREMENTS

CROSS-REFERENCE TO RELATED APPLICATIONS

This application claims priority from U.S. provisional application Ser. No. 60/275,599 by Henry A. Hill and filed Mar. 13, 2001, the contents of said provisional application being incorporated herein by reference.

BACKGROUND

This invention relates to interferometers, e.g., displacement measuring and dispersion interferometers that measure displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal.

The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. Many interferometers include nonlinearities such as what are known as "cyclic errors." The cyclic errors can be expressed as contributions to the phase and/or the intensity of the measured interference signal and have a sinusoidal dependence on the change in optical path length pnL. In particular, the first order cyclic error in phase has a sinusoidal dependence on $(2\pi pnL)/\lambda$ and the second order cyclic error in phase has a sinusoidal dependence on $2(2\pi pnL)/\lambda$. Higher order cyclic errors can also be present. Moreover, sub-harmonic cyclic errors and their harmonics can also be present. One such example is a half-cycle error in phase, which has a sinusoidal dependence on $(\pi pnL)/\lambda$.

Cyclic errors can be produced by "beam mixing," in which a portion of an input beam that nominally forms the reference beam propagates along the measurement path and/or a portion of an input beam that nominally forms the measurement beam propagates along the reference path. Such beam mixing can be caused by ellipticity in the polarizations of the input beams and imperfections in the interferometer components, e.g., imperfections in a polarizing beam splitter used to direct orthogonally polarized input beams along respective reference and measurement paths. Because of beam mixing and the resulting cyclic errors, there is not a strictly linear relation between changes in the phase of the measured interference signal and the relative optical path length pnL between the reference and measurement paths. If not compensated, cyclic errors caused by beam mixing can limit the accuracy of distance changes measured by an interferometer. Cyclic errors can also be produced by imperfections in transmissive surfaces that produce undesired multiple reflections within the interferometer and imperfections in components such as retroreflectors and/or phase retardation plates that produce undesired ellipticities in beams in the interferometer. For a general reference on the theoretical cause of cyclic error, see, for example, C. W. Wu and R. D. Deslattes, "Analytical modelling of the periodic nonlinearity in heterodyne interferometry," *Applied Optics*, 37, 6696–6700, 1998.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "Method of and Device for Repetitively Imaging a Mask Pattern on a Substrate Using Five Measuring Axes," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

SUMMARY

The invention features a system and method for reducing the contribution of cyclic errors to an interferometric position measurement of a movable stage. An initial interferometric position measurement of the stage is averaged with at least one additional measurement corresponding to a displacement(s) of the stage from its initial position. The displacements are selected to reduce the overall cyclic error contribution to an average position measurement. As a result, the average position of the stage can be measured more accurately than any of its individual positions.

Each of the selected displacements (there may be only one) corresponds to a phase shift(s) that causes a cyclic error term in the interferometric signal corresponding to that displacement to cancel a corresponding cyclic error term in the interferometric signal corresponding to one of the other positions (e.g., the initial position). The accuracy of the selected displacements are themselves limited by the presence of the cyclic errors. However, this limitation enters into the averaging as an effect that is of second order with respect to the magnitude of the cyclic errors. Thus, the averaging can eliminate specific cyclic terms to first order. Moreover, average positions can be used in subsequent averaging procedures iteratively eliminate cyclic error terms to higher orders. One way to think about the averaging is that the translation stage itself is used as a phase shifter that samples over the sinusoidal dependence of one or more cyclic error terms to reduce or eliminate (to first and/or higher order) the cyclic error contribution to the average of the interferometric signals over those samples. Accordingly, the average of such interferometric signals more accurately indicates the average position of the stage.

Although one may typically desire a reduction in the contribution of cyclic errors to the measurement of each individual position of the stage (e.g., while stepping), there are many applications where the average position measurement is useful. For example, while the stage is being scanned, the average position of the stage for each of multiple sets of stage positions can be measured, and the speed of the stage (which may vary) can be determined from the measured average positions and the time interval(s) there between. Furthermore, the actual position of the stage as a function of time can then be calculated by integration of the determined speed. In another application, the average position can be used to more accurately determine the average position of an alignment mark on a wafer carried by the stage. Furthermore, the averaging described above can be applied to additional interferometric measurement axes. For example, the averaging can be applied to two laterally displacement measurement axes that are substantially parallel to one another to more accurately determine an average angular orientation of the stage. The result can be used to more correctly determine an Abbe offset error in the average position of an off-axis alignment mark (i.e., an alignment mark that is not aligned with one of the interferometric measurement axes). Accurately determining the average position of an alignment mark is an important step in initializing an interferometric stage positioning system prior to microlithographic exposure of a wafer carried by the stage.

In general, in one aspect, the invention features an interferometric stage system including: i) a translatable stage; ii) a base defining a reference frame; iii) a positioning system coupled to the stage for adjusting the position of the stage relative to the reference frame; iv) an interferometry system which during operation directs a measurement beam along path between the stage and a portion of the base to produce an interferometric signal indicative of a position of the stage along the path; and v) an electronic controller coupled to the interferometry system and the positioning system. Because the interferometry system may generate a cyclic error contribution to the interferometric signal, the electronic controller determines an average position for the stage along the first path based on the interferometric signal corresponding to each of multiple positions of the stage. The multiple positions of the stage include an initial position and at least one additional position, and the controller selects each of the additional positions to reduce the cyclic error contribution in the average position.

Embodiments of the interferometric stage system may include any of the following features.

During operation the electronic controller can cause the positioning system to translate the stage to each of the additional positions. Alternatively, the electronic controller can monitor the stage positions as it is scanned according to some program and selected from the monitored stage positions those that the correspond to the additional positions that reduce the cyclic error contribution in the average position measurement.

The interferometric signal for a particular position of the stage can be expressed by a measured phase φ, where $$\tilde{\varphi} = \varphi + \sum_{m=1,p=1} \varepsilon_{m,p} \sin\left(\frac{m\varphi}{p} + \delta_{m,p}\right),$$

and where φ is linearly proportional to the position of the stage and the remaining terms represent the cyclic error contribution with specific cyclic errors indexed by positive integers m and p. Furthermore, at least one of the additional positions selected by the electronic controller corresponds to $\phi=\phi+(\pi+2\pi n)$ p/m for some integer n, where the initial position corresponds to $\phi=\phi_0$.

For example, the m=1, p=1 cyclic error term may be the dominant term in the cyclic error contribution, in which case the at least one additional position selected by the electronic controller consists of one additional position corresponding to the measured phase $\phi_1=\phi_0+\pi+2\pi n_1$, wherein $n_1=1$.

In another example, the m=1, p=2 cyclic error term may be the dominant term in the cyclic error contribution, in which case the at least one additional position selected by the electronic controller consists of one additional position corresponding to the measured phase $\phi_1=\phi_0+2\pi+4\pi n_1$, wherein $n_1=1$.

In yet another example, the m=2, p=1 cyclic error term is the dominant term in the cyclic error contribution, in which case the at least one additional position selected by the electronic controller consists of one additional position corresponding the measured phase $\phi_1=\phi_0+\pi/2+\pi n_1$, wherein n=1.

Furthermore, the additional positions may be selected to simultaneously reduce the contribution from multiple cyclic error terms to the average position measurement. For example, the additional positions selected by the electronic controller can include positions corresponding to the measured phases $\phi_0+\pi+4\pi n_1$, $\phi_0+2\pi+4\pi n_2$, and $\phi_0+3\pi+4\pi n_3$, for integers $n_1$, $n_2$, and $n_3$, to reduce the m=1, p=1 and m=1, p=2 cyclic error terms.

In another example, the additional positions selected by the electronic controller can include positions corresponding to the measured phases $\phi_0+\pi/2+2\pi n_1$, $\phi_0+\pi+2\pi n_2$, and $\phi_0+3\pi/2+2\pi n_3$, for integers $n_1$, $n_2$, and $n_3$, to reduce the m=1, p=1 and m=2, p=1 cyclic error terms.

Furthermore, in yet another example, the additional positions selected by the electronic controller can include positions corresponding to the measured phases $\phi_0+\pi/2+4\pi n_1$, $\phi_0+\pi+4\pi n_2$, $\phi_0+3\pi/2+4\pi n_3$, $\phi_0+2\pi+4\pi n_4$, $\phi_0+5\pi/2+4\pi n_5$, $\phi_0+3\pi+4\pi n_6$, and $\phi_0+7\pi/2+4\pi n_7$, for integers $n_1$, $n_2$, $n_3$, $n_4$, $n_5$, $n_6$, and $n_7$, to reduce the m=1, p=1; m=1, p=2; and m=2, p=1 cyclic error terms.

The average position can be linearly proportional to the average of the measured phases corresponding to the multiple positions. Furthermore, the electronic controller can determine the average position by applying a digital filter to the interferometric signals corresponding to the multiple positions.

The system can further include an alignment scope coupled to the electronic controller. During operation the electronic controller determines whether an alignment mark on a wafer carried by the stage is within view of the alignment scope, and the initial position and the additional positions selected by the electronic controller are positions in which the alignment mark is within the view of the alignment scope.

During operation the electronic controller may determine a second average position of the stage corresponding to a second set of multiple positions of the stage, and the electronic controller can further determine a speed for the stage based on the first-mentioned average position and the second average position.

During operation the interferometry system can direct a second measurement beam along a second path between the stage and the portion of the base to produce a second interferometric signal indicative of a position of the stage along the second path. In such a case, the interferometry system may include two separate interferometers, the first interferometer directing the first measurement beam and the second interferometer directing the second measurement beam. Alternatively, the interferometry system may include a multi-axis interferometer providing measurement axes along the first and second paths.

Furthermore, the electronic controller may determine an average position of the stage along the second path based on the second interferometric signal corresponding to each of the multiple positions of the stage. For example, the first and second paths can be parallel to one another. Also, during operation the electronic controller can determine an angular orientation for the stage based on the average position of the stage along the first path and the average position of the stage along the second path. Moreover, the translation of the stage to each of the additional positions can cause the first and second interferometric signals to change by the same amount relative to the first and second interferometric signals for the initial position. The system may further include an alignment scope coupled to the electronic controller, wherein during operation the electronic controller determines whether an alignment mark on a wafer carried by the stage is within view of the alignment scope, and wherein the initial position and the additional positions selected by the electronic controller are positions in which the alignment mark is within the view of the alignment scope. Thus, the electronic controller can further determines an Abbe offset error for the alignment mark based on the angular orientation determined by the processor and an off-set distance corresponding to a lateral displacement between the alignment mark and the first measurement beam path.

The interferometry system can include an interferometer secured to the portion of the base and a measurement object secured to the stage, wherein during operation the interferometer directs the measurement beam to reflect from the measurement object. Alternatively, it can include an interferometer secured to the stage and a measurement object secured to the portion of the base, wherein during operation the interferometer directs the measurement beam to reflect from the measurement object. Furthermore, the interferometry system may direct the measurement beam to pass between the stage and the portion of the base more than once.

In general, in another aspect, the invention features an interferometric method including: i) generating an interferometric signal for each of multiple positions of the stage, wherein the interferometric signal indicates the stage position along a first path and wherein the multiple positions of the stage include an initial position and at least one additional position; ii) determining an average position for the stage based on the interferometric signal corresponding to each of multiple positions; and iii) selecting the at least one additional position to reduce a cyclic error contribution from the interferometric signal in the average position.

Embodiments of the method may include any of the following features.

The interferometric signal for a particular position of the stage can be expressed by a measured phase φ, where $$\tilde{\varphi} = \varphi + \sum_{m=1,p=1} \varepsilon_{m,p} \sin\left(\frac{m\varphi}{p} + \delta_{m,p}\right),$$

and where φ is linearly proportional to the position of the stage and the remaining terms represent the cyclic error contribution with specific cyclic errors indexed by positive integers m and p, and wherein at least one of the selected additional positions corresponds to $\phi=\phi_0+(\pi+2\pi n)p/m$ for some integer n, where the initial position corresponds to $\phi=\phi_0$.

For example, the m=1, p=1 cyclic error term may be the dominant term in the cyclic error contribution, in which case the at least one selected additional position consists of one additional position corresponding to the measured phase $\phi_1=\phi_0+\pi+2\pi n_1$, wherein $n_1=1$.

In another example, the m=1, p=2 cyclic error term may be the dominant term in the cyclic error contribution, in which case the at least one selected additional position consists of one additional position corresponding to the measured phase $\phi_1=\phi_0+2\pi+4\pi n_1$, wherein $n_1=1$.

In yet another example, the m=2, p=1 cyclic error term is the dominant term in the cyclic error contribution, in which case the at least one selected additional position consists of one additional position corresponding the measured phase $\phi_1=\phi_0+\pi/2\pi n_1$, wherein $n_1=1$.

Furthermore, the additional positions may be selected to simultaneously reduce the contribution from multiple cyclic error terms to the average position measurement. For example, the selected additional positions can include positions corresponding to the measured phases $\phi_0+\pi+4\pi n_1$, $\phi_0+2\pi+4\pi n_2$, and $\phi_0+3\pi+4\pi n_3$, for integers $n_1$, $n_2$, and $n_3$, to reduce the m=1, p=1 and m=1, p=2 cyclic error terms.

In another example, the selected additional positions can include positions corresponding to the measured phases $\phi_0+\pi/2+2\pi n_1$, $\phi_0+\pi+2\pi n_2$, and $\phi_0+3\pi/2+2\pi n_3$, for integers $n_1$, $n_2$, and $n_3$, to reduce the m=1, p=1 and m=2, p=1 cyclic error terms.

Furthermore, in yet another example, the selected additional positions can include positions corresponding to the measured phases $\phi_0+\pi/2+4\pi n_1$, $\phi_0+\pi+4\pi n_2$, $\phi_0+3\pi/2+4\pi n_3$, $\phi_0+2\pi+4\pi n_4$, $\phi_0+5\pi/2+4\pi n_5$, $\phi_0+3\pi+4\pi n_6$, and $\phi_0+7\pi/2+4\pi n_7$, for integers $n_1$, $n_2$, $n_3$, $n_4$, $n_5$, $n_6$, and $n_7$, to reduce the m=1, p=1; m=1, p=2; and m=2, p=1 cyclic error terms.

Determining the average position can include averaging the measured phases corresponding to the additional positions. The averaging of the measured phases can include applying a digital filter to the interferometric signals corresponding to the multiple positions.

The method can further include determining whether an alignment mark on a wafer carried by the stage is within view of an alignment scope, in which case the initial position and the selected additional positions are positions in which the alignment mark is within the view of the alignment scope.

The method can further include: determining a second average position of the stage corresponding to a second set of multiple positions of the stage, and determining a speed for the stage based on the first-mentioned average position and the second average position.

The method can further include: generating a second interferometric signal for each of the multiple positions, wherein the second interferometric signal is indicative of the stage position along a second path; and determining an average position of the stage along the second path based on the second interferometric signals. For example, the first and second paths can be parallel to one another. The method can further include determining an angular orientation for the stage based on the average position of the stage along the first path and the average position of the stage along the second path. The translation of the stage to each of the additional positions can cause the first and second interferometric signals to change by the same amount relative to the first and second interferometric signals for the initial position. Also, the method can further include determining whether an alignment mark on a wafer carried by the stage is within view of an alignment scope, in which case the initial position and the selected additional positions are positions in which the alignment mark is within the view of the alignment scope. In addition, the method can further include determining an Abbe offset error for the alignment mark based on the angular orientation and an off-set distance corresponding to a lateral displacement between the alignment mark and the first path.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

The details of one or more embodiments of the invention are set forth in the accompanying drawings and the description below. Other features invention will be apparent from the description and drawings, and from the claims.

DESCRIPTION OF DRAWINGS

Like reference symbols in the various drawings indicate like elements.

DETAILED DESCRIPTION

Figure 1:
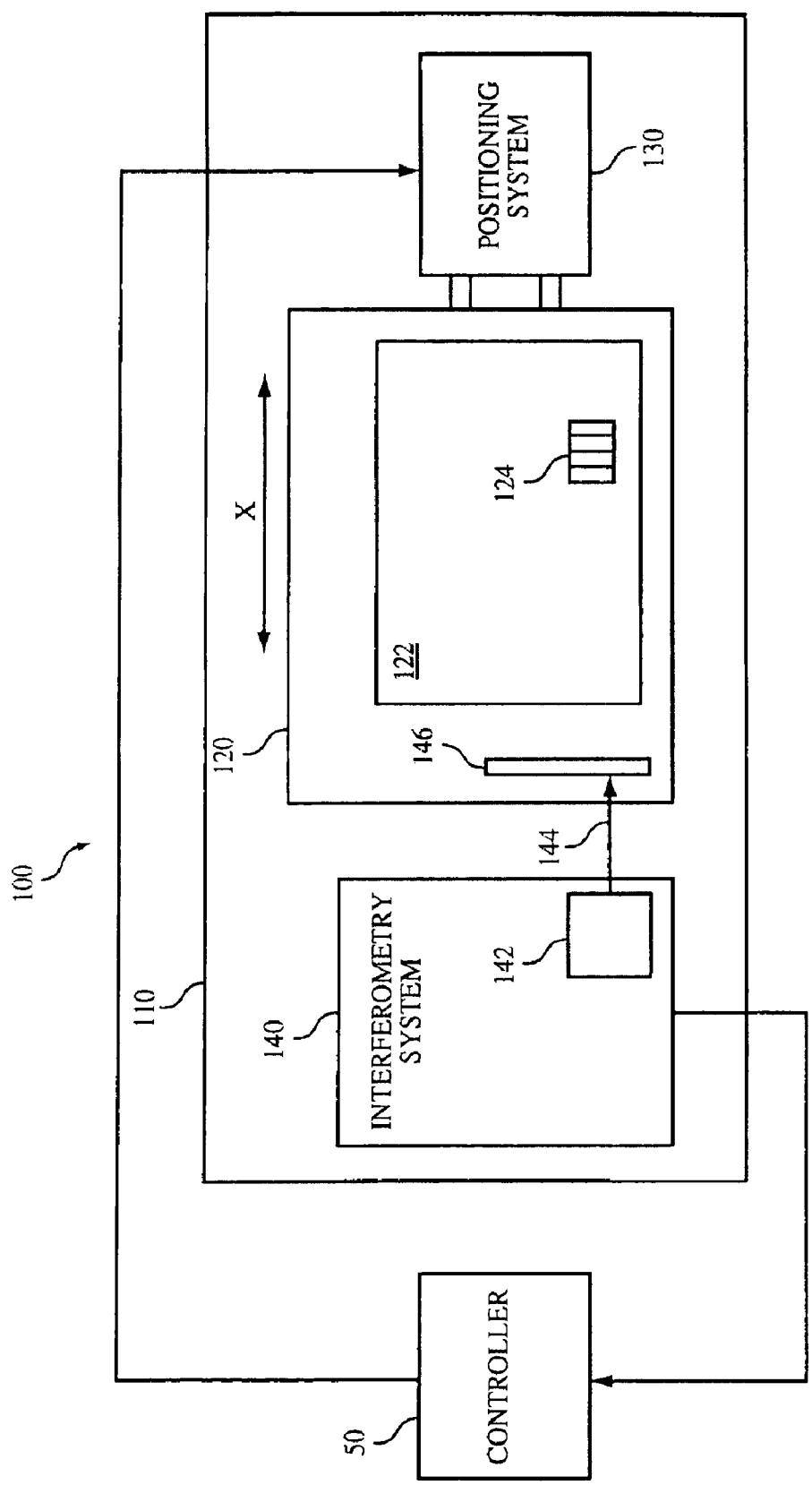
FIG. 1 is a schematic diagram of an interferometric stage positioning system.

Referring to FIG. 1, an interferometric stage system 100 includes a base 110 defining a reference frame, a stage 120 that moves relative to the reference frame defined by the base, a positioning system 130 for adjusting the position of the stage relative the base, an interferometry system 140 for measuring the positing of the stage relative to the base, and an electronic controller 150 coupled to the detector and the positioning system for controlling the position of the stage in response to position measurements by the interferometry system. In microlithography applications, for example, stage 120 is suitable for carrying a semiconducting wafer 122 having an alignment mark 124. Positioning system 130 may include, for example, one or more piezoelectric transducers and/or one or more electrical motors for adjusting the position of the stage. In the embodiment shown in FIG. 1, interferometry system 140 includes an interferometer 142 that is secured to the base and directs a measurement beam 144 to contact, and reflect back from, a plane mirror 146 secured to the stage. In another embodiment, the interferometer can be secured to the stage and the plane mirror can be secured to the base. In either case, the plane mirror defines a measurement object for interferometer, and the interferometer measures changes in the position of the stage relative to the base with respect to a measurement axis defined by the path of the measurement beam. In further embodiments, the measurement object may be a retroreflector rather than a plane mirror.

Interferometer 142 may be any type of distance measuring interferometer, e.g., a Michelson interferometer, a differential plane mirror interferometer (DPMI), a high stability plane mirror interferometer (HSPMI), etc. Furthermore, interferometer 142 may direct the measurement beam contact the measurement object multiple times. In addition, interferometer 142 can be an integrated multi-axis interferometer that generates multiple measurement beams to provide multiple axes of metrology. See, e.g., "Differential interferometer arrangements for distance and angle measurements: Principles, advantages and applications" by C. Zanoni, VDI Berichte Nr. 749, 93–106(1989). Also, interferometry system 140 may include one or more additional interferometers for providing such multiple axes of metrology.

Figure 2:
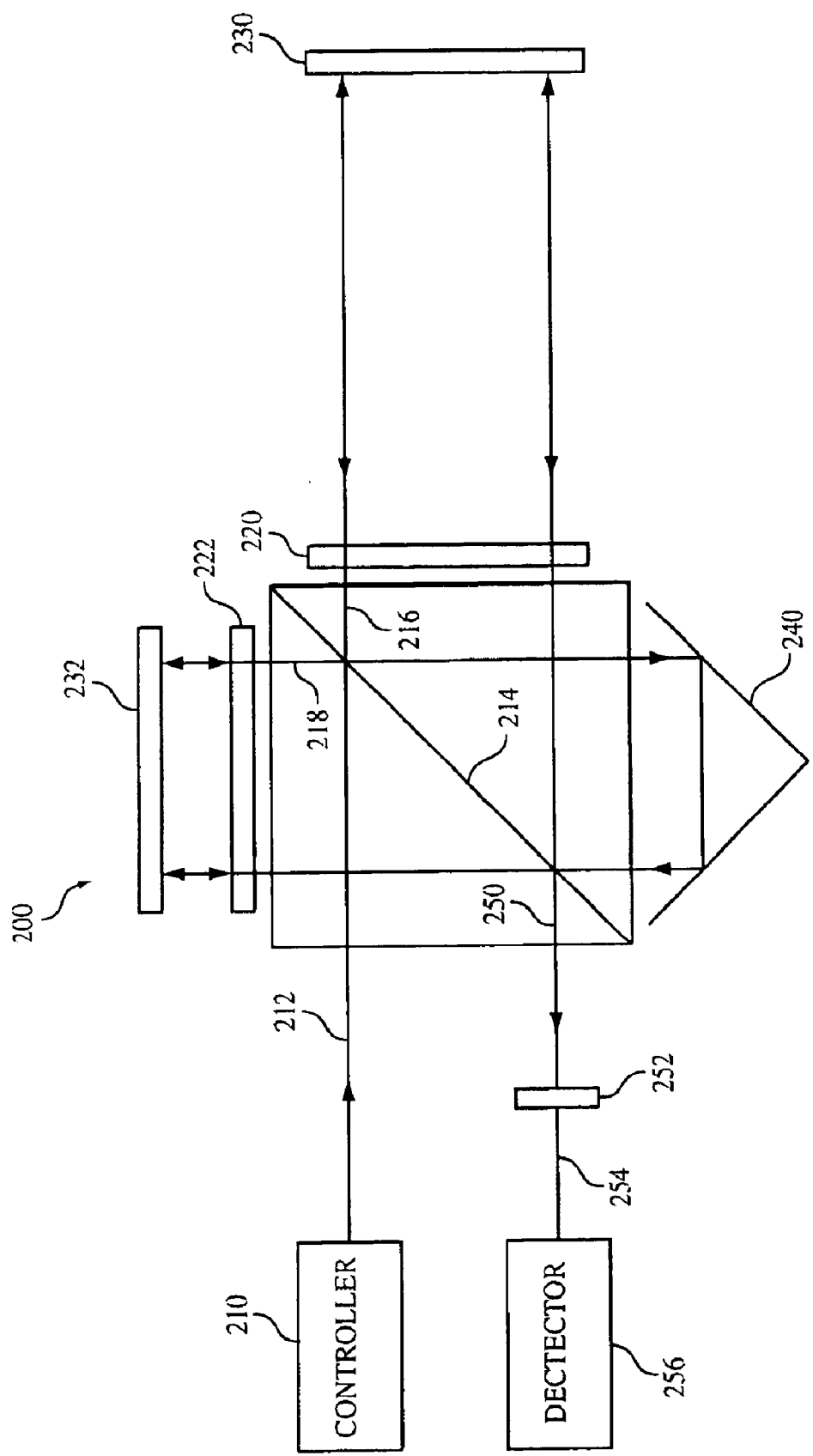
FIG. 2 is one embodiment of an interferometer for use in the stage positioning system of FIG. 1.

One particular embodiment for interferometry system 140 is shown in FIG. 2 as high stability plane mirror interferometer 200. Referring to FIG. 2, a light source 210 provides an input beam 212 having a heterodyne frequency splitting between orthogonal linear polarization components. The input beam is incident on a polarizing beam splitter 214, which transmits one of the polarization components to define a measurement beam 216 and reflects the other polarization component to a define a reference beam 218.

The measurement beam passes through a measurement quarter wave plate 220 and travels along a measurement path to contact a plane mirror measurement object 230, which reflects the measurement beam back through wave plate 220 to polarizing beam splitter 214. Because of the double pass through wave plate 220, polarizing beam splitter 214 now reflects the measurement beam towards a retroreflector 240, which in turn directs the beam back to the polarizing beam splitter. Thereafter, polarizing beam splitter 214 directs the measurement beam back through wave plate 220 to make a second pass to plane mirror measurement object 230. The measurement object then reflects the measurement beam back through wave plate 220 to polarizing beam splitter 214, which, following the double pass through wave plate 220, now transmits the measurement beam as the measurement beam component of an output beam 250.

The reference beam, on the other hand, passes through a reference quarter wave plate 222 and travels along a reference path to contact a plane mirror reference object 232, which reflects the reference beam back through wave plate 222 to polarizing beam splitter 214. Because of the double pass through wave plate 222, polarizing beam splitter 214 now transmits the reference beam towards retroreflector 240, which in turn directs the beam back to the polarizing beam splitter. Thereafter, polarizing beam splitter 214 directs the reference beam back through wave plate 222 to make a second pass to plane mirror reference object 232. The reference object then reflects the reference beam back through wave plate 222 to polarizing beam splitter 214, which, following the double pass through wave plate 222, now reflects the reference beam as the reference beam component of output beam 250.

A polarizer 252 is positioned to receive output beam 250 and functions as an analyzer that selects a linear polarization that mixes the measurement and reference beam components to produce a mixed beam 254 whose intensity is measured by a detector 256. As described farther above, the intensity measured by the detector includes an interference signal that oscillates at the heterodyne frequency (or the sum of the heterodyne frequency and a Doppler shift if the stage is moving), and the phase of that interference signal indicates the position of the stage.

Referring again to FIG. 1, electronic controller 150 receives the interferometric signal from interferometry system 140 and extracts the phase $\phi$ of the interferometric signal to determine an estimate for the position of stage 120. Processor 150 derives phase shift $\phi$ by known techniques used in processing heterodyne signals for phase information. For example, the processing is by either digital or analog signal processes, preferably digital processes, using time-based phase detection such as a digital Hilbert transform phase detector [see section 4.1.1 of "Phase-locked loops: theory, design, and applications" 2nd ed. McGraw-Hill (N.Y.) 1993, by R. E. Best]

For the subsequent analysis, we assume that the only error contribution to the measured phase $\phi$ of the interferometric signal are cyclic errors terms, and we also select a reference frame in which all phase offset terms (i.e., phase terms which do not vary with changes in the position of the stage) sum to zero. As a result, the measured phase $\phi$ can be expressed as:

$$\phi = \tilde{\phi} + \psi \tag{1}$$

where $\tilde{\phi}$ is the phase in the absence of any cyclic errors and $\psi$ represents the cyclic error terms. As described further above, the phase $\tilde{\phi}$ is linearly proportional to the position of the stage. For example, for the double-pass interferometer of FIG. 2, we have $\tilde{\phi} = 8\pi n x/\lambda$, where x is the position of the stage (relative to an initial position at which the phase $\tilde{\phi}$ is set to zero) and where, as defined farther above, n is the refractive index along the measurement path and $\lambda$ is the wavelength of the interferometer beams. The cyclic error contribution terms $\psi$ can be expressed as follows:

$$\psi = \sum_{m=1,p=1} \varepsilon_{m,p} \sin\left(\frac{m\tilde{\phi}}{p} + \delta_{m,p}\right) \tag{2}$$

where specific cyclic errors terms are indexed by positive integers m and p, and are sinusoidal terms with respect to $\tilde{\phi}$, and have an amplitude $\varepsilon_{m,p}$ and a phase offset $\delta_{m,p}$. For example, the m=1, p=1 cyclic error term corresponds to a first order harmonic cyclic error, which for many interferometers is the dominant term that results from beam mixing (which was described in the Background section above). In another example, the m=1, p=2 cyclic error term corresponds to a half-cycle cyclic error, which, for the case of the interferometer in FIG. 2, can result from an additional reflection between the measurement quarter wave plate and the measurement stage during one of the passes.

We note that commonly owned U.S. Pat. Nos. 6,137,574, 6,246,481, and 6,252,668, all by Henry A. Hill, describe cyclic error sources, and methods and systems for characterizing and reducing such errors. For example, the '574 patent discloses the use of a phase shifter to vary the measured phase (and the cyclic error terms) independently of the stage and thereby characterize and/or reduce the cyclic error terms. In the present invention, electronic controller 150 uses the stage itself as a phase shifter for determining the average position of the stage with a reduced cyclic error contribution.

As an example, we consider the case where only the first order cyclic error term is relevant to the measurement (i.e., it dominants the cyclic error contribution). In this situation we have:

$$\tilde{\phi} = \phi + \epsilon_{1,1} \sin(\phi + \delta_{1,1}) \quad (3).$$

Therefore, for an initial position of the stage corresponding to the phase $\phi \equiv \phi_0$ and a subsequent translation of the stage to a new position corresponding to $\phi \equiv \phi_1 = \phi_0 + \pi$, the measured phase corresponding to the average position, $$\frac{(\tilde{\varphi}(\varphi_0) + \tilde{\varphi}(\varphi_1))}{2},$$

eliminates the cyclic error term and is linearly proportional to the average position of the stage:

$$\frac{(\tilde{\varphi}(\varphi_0) + \tilde{\varphi}(\varphi_1))}{2} = \frac{\varphi_0 + \varphi_1}{2}. \quad (4)$$

Unfortunately, one may think that it is difficult for the electronic controller to cause the positioning system to precisely translate the stage to the new position corresponding to $\phi \equiv \phi_1 = \phi_0 + \pi$ because of the cyclic error contribution. In other words, absent a characterization or minimization of the cyclic error contribution, the electronic controller adjusts the position of the stage based on the measured phase $\tilde{\phi}$, which is only approximately linearly proportional to the position of the stage, rather than the actual phase $\phi$, which is identically linearly proportional to the position of the stage.

However, when the cyclic error contribution to the measured phase is relatively small when compared to the actual phase (which is typically the case), the electronic controller can approximate the desired translation using the measured phase. In other words, from the initial position, which corresponds to the measured phase $\tilde{\phi} \equiv \tilde{\phi}(\phi_0) = \tilde{\phi}_0$, the electronic controller causes the positioning system to translate the stage until the measured phase corresponds to $\tilde{\phi} \equiv \tilde{\phi}_1 = \tilde{\phi}_0 + \pi$. Inspection of Eq. 3 shows that the average measured phase for eliminates the cyclic error term to first order:

$$\frac{(\tilde{\varphi}_0 + \tilde{\varphi}_1)}{2} = \frac{\varphi_0 + \varphi_1}{2} + O(\epsilon_{1,1}^2) \quad (5)$$

where the second term on the right-hand side of Eq. 5 indicates terms that that are second order or higher with respect to the cyclic error amplitude. This result follows from the fact that Eq. 3 can rewritten as:

$$\tilde{\phi} = \phi + \epsilon_{1,1} \sin(\phi + \delta_{1,1}) + o(\epsilon_{1,1}^2) \quad (6),$$

where the last term can be ignored when the cyclic error amplitude is small. For example, a cyclic error with an amplitude of about 4% (with respect to the amplitude of the primary heterodyne signal) typically causes an error of about 1 nm in the stage translation, thus the second order error corresponds to about 4% of 1 nm or 40 pm. As a result, the electronic controller can determine an average position of the stage for the two positions that greatly reduces a cyclic error contribution present in either of the individual position measurements.

The technique can be generalized to other cyclic error terms. For example, to eliminate a particular cyclic error term indexed by m and p, the stage is translated from its initial position until the measured phase changes by $\pi p/m$, and the average position of the stage is determined from the average of the two measured phases. Moreover, the translation may include trivial full cycle variations. In other words, the cyclic error term is eliminated (to first order) when the is translated from its initial position until the measured phase changes $(\pi + 2\pi n)p/m$ for any integer n.

Furthermore, the electronic controller may cause the positioning system to translate the stage from an initial position to multiple additional positions to simultaneously eliminate multiple cyclic error terms (to at least first order) when determining an average position for the initial position of the additional positions. For example, to eliminate the first order cyclic error term (m=1, p=1) and the half-cycle cyclic error term (m=1, p=2) in an average position calculation, the stage is translated from its initial position corresponding to $\phi_0$, to the additional positions corresponding to $\phi_1 = \phi_0 + \pi$, $\phi_2 = \phi_0 + 2\pi$, and $\phi_3 = \phi_0 + 3\pi$. Thus inspection of Eq. 2 for the particular cyclic error terms in question shows that the average position corresponding to the average of the measured phases over the four positions eliminates the cyclic errors to first order:

$$\frac{(\tilde{\varphi}_0 + \tilde{\varphi}_1 + \tilde{\varphi}_2 + \tilde{\varphi}_3)}{4} = \frac{\varphi_0 + \varphi_1 + \varphi_2 + \varphi_3}{4} + O[\epsilon_{1,1}^2, \epsilon_{1,2}^2, (\epsilon_{1,1}\epsilon_{1,2})]. \quad (7)$$

Similarly, to further eliminate the second order cyclic error term (which corresponds to the indices m=1, p=1)in the average position measurement, the stage is translated from its initial position corresponding to $\phi_0$, to the additional positions corresponding to $\phi_1 = \phi_0 + \pi/2$, $\phi_2 = \phi_0 + \pi$, $\phi_3 = \phi_0 + 3\pi/2$, $\tilde{\phi}_4 = \phi_0 + 2\pi$, $\tilde{\phi}_5 = \phi_0 + 5\pi/2$, $\tilde{\phi}_6 = \phi_0 + 3\pi$, and $\phi_7 = \phi_0 + 7\pi/2$. Furthermore, any translations may additionally include the trivial full cycle variations. Thus, in the two examples above (which both include the half cycle cyclic error), any of the translations may further include a shift of $4\pi n$ for any integer n.

Notably, this last example can eliminate the cyclic error terms to both first and second order. This is because the second order error in the translation of the stage with respect the half-cycle error takes the form of the m=1, p=1 term, and is therefore eliminated by the $\pi$-phase shifts, and the second order error in the translation of the stage with respect to first order cyclic error term takes the form of the m=2, p=1 term and is therefore eliminated by the $\pi/2$-phase shifts. Finally, the amplitude of the second order cyclic error term (i.e., the m=2, p=1 term) is typically a second order effect in the first place (i.e., $\epsilon_{2,1} = o(\epsilon_{1,1}^2)$), and therefore and the second order error in the translation of the stage with respect to it can be ignored. More generally, the averaged positions determined above can be used in subsequent averaging measurements to iteratively eliminate the cyclic error contribution to higher orders.

In preferred embodiments, the electronic controller implements the averaging of the measured phases corresponding to each of the multiple stage positions as a digital filter.

Furthermore, the electronic controller may translate the stage by the amounts required for the elimination of the selected cyclic error terms (to first and/or higher orders) as a part of a more general programmed schedule. In other words, as a part of a general program for positioning the stage (which may, for example, be based on a servo loop with the measured phase $\tilde{\phi}$ and therefore subject to the cyclic error contribution), the electronic controller can monitor the measured phase $\tilde{\phi}$ and calculate an average position of the stage at one or more times during the program based on only a subset of monitored phases. Using the average position information and the time intervals between the sets of underlying phase measurements for each average position measurement, the electronic controller can determine the speed of the stage, either during the program or as a part of some subsequent offline analysis. Because the average position measurements have a reduced contribution from cyclic errors, the determined speed also has a reduced cyclic error contribution. Moreover, integration of the speed can give the position of the stage as a function of time, with the so-determined position information also having a reduced cyclic contribution.

In another application, an average position determined by the electronic controller using the technique described above is used to more accurately determine the position of an alignment mark on a wafer used to initialize the stage positioning system prior to exposure of the wafer in a microlithographic procedure. For example, referring again to FIG. 1, the stage carries semiconducting wafer 122 having alignment mark 124. During the initialization procedure, an alignment scope (not shown) determines when the stage is positioned such that the alignment mark is in view, which defines an initial stage position for the calculation above. The stage is then translated to one or more additional positions as described above, with alignment mark remaining in view. Using the technique above, the electronic controller determines the average position of the stage with respect to the initial position and each of the additional positions (there may only be one) using the interferometric data. At the same time, the alignment mark includes features (e.g., a grating pattern) that allows the alignment scope to determine relative changes in the position of the alignment mark during the stage translations. Based on this, the alignment scope determines an alignment mark position that corresponds to the average position of the stage during the translations. As a result, the interferometrically determined average position of the stage is registered with a particular position on the alignment mark and thus a particular part of the wafer, which is what is necessary for the initialization. Because the technique described above is used, the resulting alignment mark position has a reduced contribution from cyclic errors.

The averaging techniques described above can also be used to determine an average angular orientation for the translation stage based on multiple interferometric measurement axes.

As described below in conjunction with FIG. 3, the determination of an average angular orientation can be very important, for example, when the position of an alignment mark is required and the alignment mark is off-axis (i.e., laterally displaced) relative to any of the available interferometric metrology axes. In such cases, the angular orientation of that stage is determined to calculate an Abbe offset error for the position of the off-axis alignment mark. Unfortunately, the lateral displacement of the alignment mark can greatly increase the cyclic error contribution to the Abbe offset error.

The cyclic errors in the location of off-axis alignment marks are generally larger then the cyclic errors in the individual linear displacement interferometric measurements used to determine changes in the angle. One reason for the larger effects of cyclic errors is that the angle measurement is proportional to the difference of two linear displacement interferometric measurements wherein cyclic errors are present in each of the two linear displacement interferometric measurements and cyclic errors present in one of the two linear displacement interferometric measurements are generally different from the cyclic errors present in the second of the two linear displacement interferometric measurements. A second reason for the larger effects of cyclic errors arises when the off-axis displacement of the off-axis alignment scope is larger than the spatial separation of the measurement beams of the linear displacement interferometers used in determination of the changes of the angle. In such cases, the cyclic error contribution to the location of the alignment mark is increased by a factor greater than one. This factor is equal to the ratio of the off-axis displacement of the off-axis alignment scope to the spatial separation of the measurement beams of the linear displacement interferometers.

In following embodiment, the averaging technique described above is used to reduce the contribution of cyclic errors to the interferometrically determined position of an off-axis alignment mark.

Figure 3:
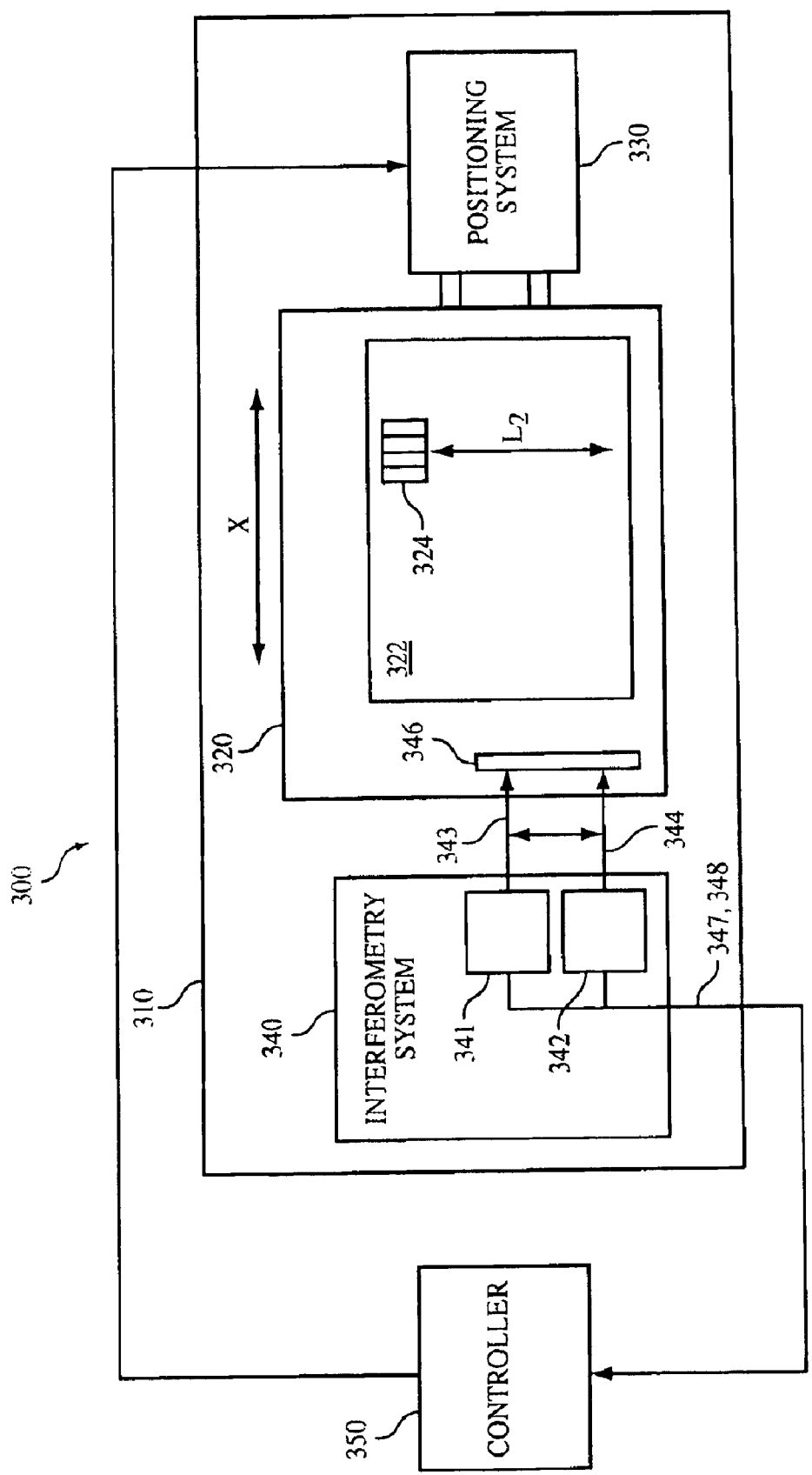
FIG. 3 is another embodiment of an interferometric stage positioning system.

Referring to FIG. 3, an interferometric stage system 300 includes a base 310 defining a reference frame, a stage 320 that moves relative to the reference frame defined by the base, a positioning system 330 for adjusting the position of the stage relative the base, an interferometry system 340 for measuring the positing of the stage relative to the base, and an electronic controller 350 coupled to the detector and the positioning system for controlling the position of the stage in response to position measurements by the interferometry system. In microlithography applications, for example, stage 320 is suitable for carrying a semiconducting wafer 322 having an alignment mark 324. The elements of stage system 300 are the same as the corresponding elements of stage system 100 except that interferometry system 340 includes two interferometers 341 and 342 directing measurement beams 343 and 344, respectively, to a bar mirror 346 secured to the stage. Thus, interferometry system 340 provides two measurement axes. Also, alignment mark 324 is off-axis from both measurement axes.

Interferometers 341 and 342 generate electronic signals 347 and 348, respectively, which are transmitted to electronic controller 350 where they are processed to determine the position of stage 320 in the x direction and changes in the angle of bar mirror 346 in the plane of FIG. 3.

Interferometers 341 and 342 measure phase shifts $\phi_1$ and $\phi_2$, respectively, between the measurement and reference beams of interferometers 341 and 342, respectively. The magnitude of phase shifts $\phi_1$ and $\phi_2$ can be expressed in the same way as in Eq. 1 (as well as the other equations) above, except that subscripts are now used to associate a given term with a particular interferometer.

Electronic controller 350 determines the angle $\theta$ of bar mirror 345 according to the formula $$\vartheta = \frac{(\tilde{\varphi}_2 - \tilde{\varphi}_1)}{4k} \frac{1}{L_1} \tag{8}$$

where $L_1$ is the spatial separation of measurement beams 343 and 344 as shown in FIG. 3 and k equals $2\pi/\lambda$.

The cyclic error contribution on the measured value of $\theta$ is clearly evident combining Eqs. 1 and 8:

$$\vartheta = \frac{(\tilde{\varphi}_2 - \tilde{\varphi}_1)}{4kL_1} + \frac{(\psi_2 - \psi_1)}{4kL_1}. \tag{9}$$

Notably, the cyclic error contribution can be transferred to the actual position of the stage as the electronic controller causes the positioning system to adjust the position of the stage in response to the signals from the interferometry system. The angular error $\theta_\psi$ in the angular orientation of the stage is obtained from Eq. 9 as $$\theta_\psi = \frac{(\psi_2 - \psi_1)}{4kL_1}. \tag{10}$$

The anglar error $\theta_\psi$ translates to an error $x_{alignment\ mark}$ in the location of the off-axis alignment mark 324 (see FIG. 3) as $$x_{alignment\ mark} = \frac{(\psi_2 - \psi_1)}{4k} \frac{L_2}{L_1} \tag{11}$$

where $L_2$ is the displacement off axis of the alignment scope (not shown) and alignment mark 342. It is evident on inspection of Eq. 11 that the cyclic error contribution to the position of the off-axis alignment mark is approximately $2L_2/L_1$ times larger than that made by a single linear displacement interferometer for an on-axis alignment mark.

As described above, because of the sinusoidal dependence of the cyclic error terms, the error $x_{alignment\ mark}$ in the location of the off-axis alignment mark 324 can be reduced by calculating the angle $\theta$ from multiple values of the phase shifts ($\phi_1$ and ($\phi_2$ that filter or average the sinusoidal contributions of the cyclic error terms. For example, the multiple values of phase shifts $\phi_1$ and $\phi_2$ can correspond to one or more translations of stage 320 along the x-direction. Thus, the angle $\theta$ can be calculated for each such position of the stage. These values of $\theta$ can then be processed or averaged using an integral transform filter (e.g., a digital transform filter) to determine a final value for $\theta$ and/or the alignment mark location for which the cyclic error contribution is minimized.

The translations necessary to eliminate one or more selected cyclic error terms (to first order and/or higher orders) follow identically from those described above for the average position calculation. For example, to eliminate the first order cyclic error term (m=1, p=1), a first value $\theta^{(0)}$ of the angle is determined from Eq. 9 corresponding to a stage positioned defined by measured phases ($\phi_1 \equiv \phi_1^{(0)}$, $\phi_2 \equiv \phi_2^{(0)}$) for each of the metrology axes. Then, the stage position is adjusted such that each of the measured phases changes by $\pi$. A second value $\theta^{(1)}$ of the angle is determined from Eq. 9 corresponding to the new stage position (($\phi_1 \equiv \phi_1^{(0)} + \pi$, $\phi_2 \equiv \phi_2^{(0)} + \pi$). Accordingly, in this example, the digital transform filter can be expressed as $$\theta_{output} = \frac{[\vartheta(\tilde{\varphi}_1^{(0)} + \pi, \tilde{\varphi}_2^{(0)} + \pi) + \vartheta(\tilde{\varphi}_1^{(0)}, \tilde{\varphi}_2^{(0)})]}{2}. \tag{13}$$

This average angle measurement can then be used to more accurately determine the position of the off-axis alignment mark, and eliminate a cyclic error contribution (to first and/or higher orders) to the registration of a particular part of the alignment mark with a position measured by the interferometry system. As in the calculation of the average position measurement, the translation may be selected to eliminate a different cyclic error term, and additional translations may be used to simultaneously eliminate multiple cyclic error terms in the average angle measurement. Moreover, as also described above, any of the translations may include the trivial fall cycle shifts (relative to the lowest frequency cyclic error being addressed).

The steps preformed by the electronic controller described above can be implemented in computer programs using standard programming techniques and/or may be hardwired into dedicated integrated circuits. Moreover, the steps performed by the electronic controller may be distributed among separate electronic components that are coupled to one another. The electronic procedures may execute on programmable computers each comprising an electronic processor, a data storage system (including memory and/or storage elements), at least one input device, and least one output device, such as a display or printer. Program code for the procedure is applied to input data (e.g., intensity measurements by the interferometry system) to perform the functions described herein and generate output information (e.g., average position and angle information, alignment mark position, and stage speed), which is applied to one or more output devices. Each such program can be implemented in a high-level procedural or object-oriented programming language, or an assembly or machine language. Furthermore, the language can be a compiled or interpreted language. Each such computer program can be stored on a computer readable storage medium (e.g., CD ROM or magnetic diskette) that when read by a computer can cause the processor in the computer to perform the procedures described herein.

The interferometric stage systems described above provide highly accurate measurements because the reduce cyclic error contributions. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages.

Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized, for at least some applications such as initialization with the alignment mark(s).

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology*(Marcel Dekker, Inc., New York, 1998), the contents of which is incorporated herein by reference.

Interferometry systems can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4A:
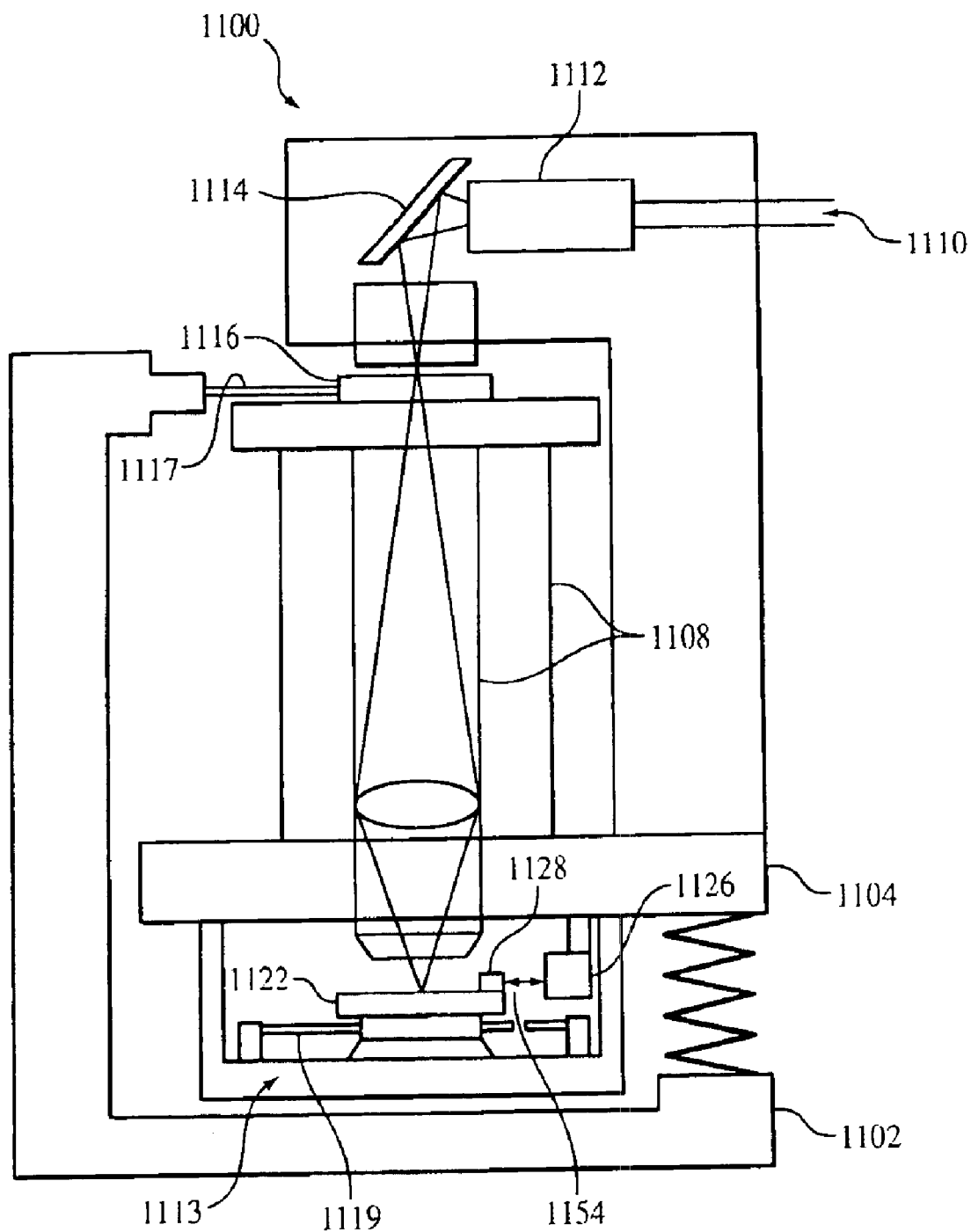
FIG. 4a is a schematic diagram of a lithography system used to make integrated circuits.

An example of a lithography scanner 1100 using an interferometry system 1126 is shown in FIG. 4a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 4B:
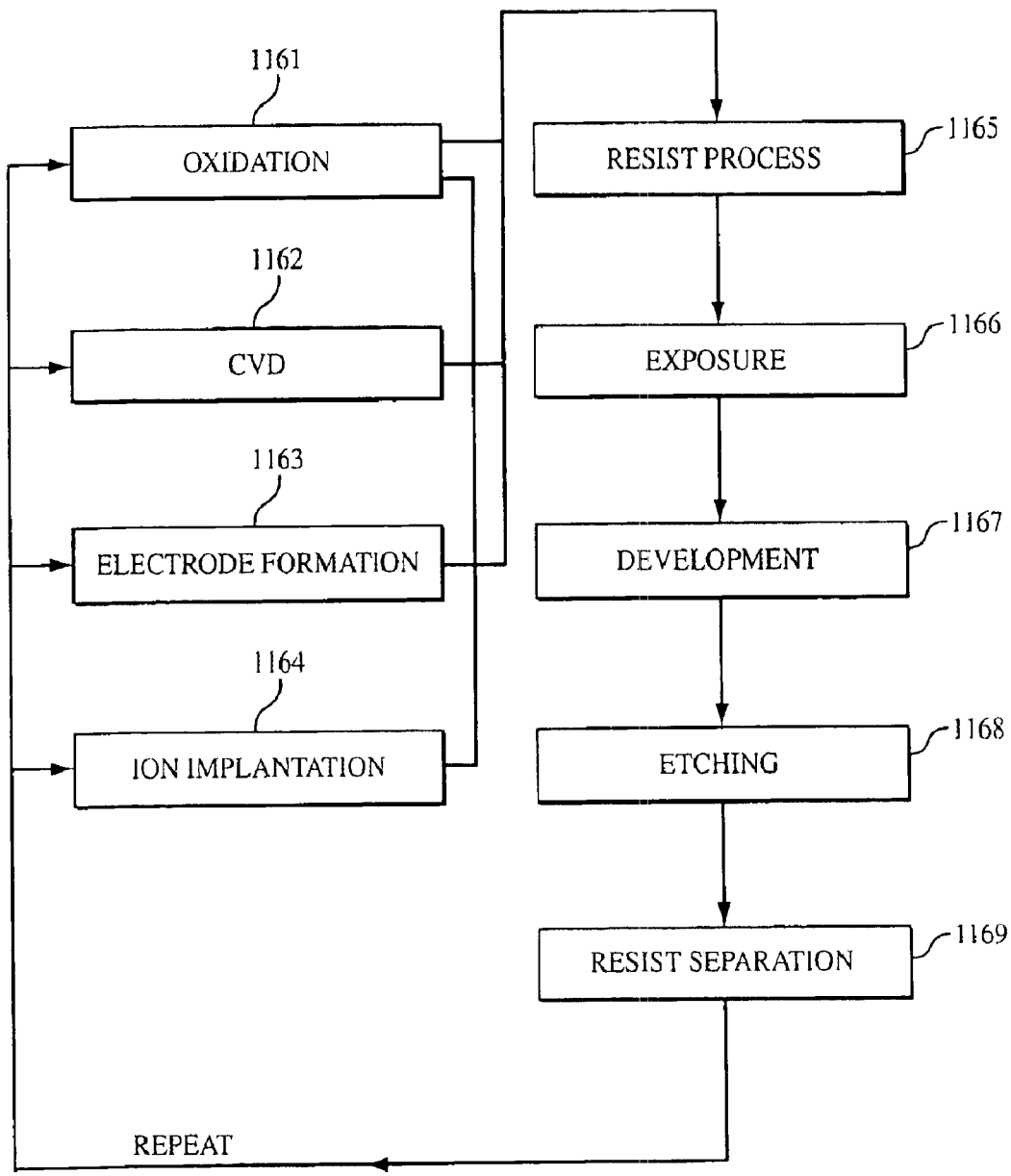
FIGS. 4b–4c are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 4b and 4c. FIG. 4b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 4C:
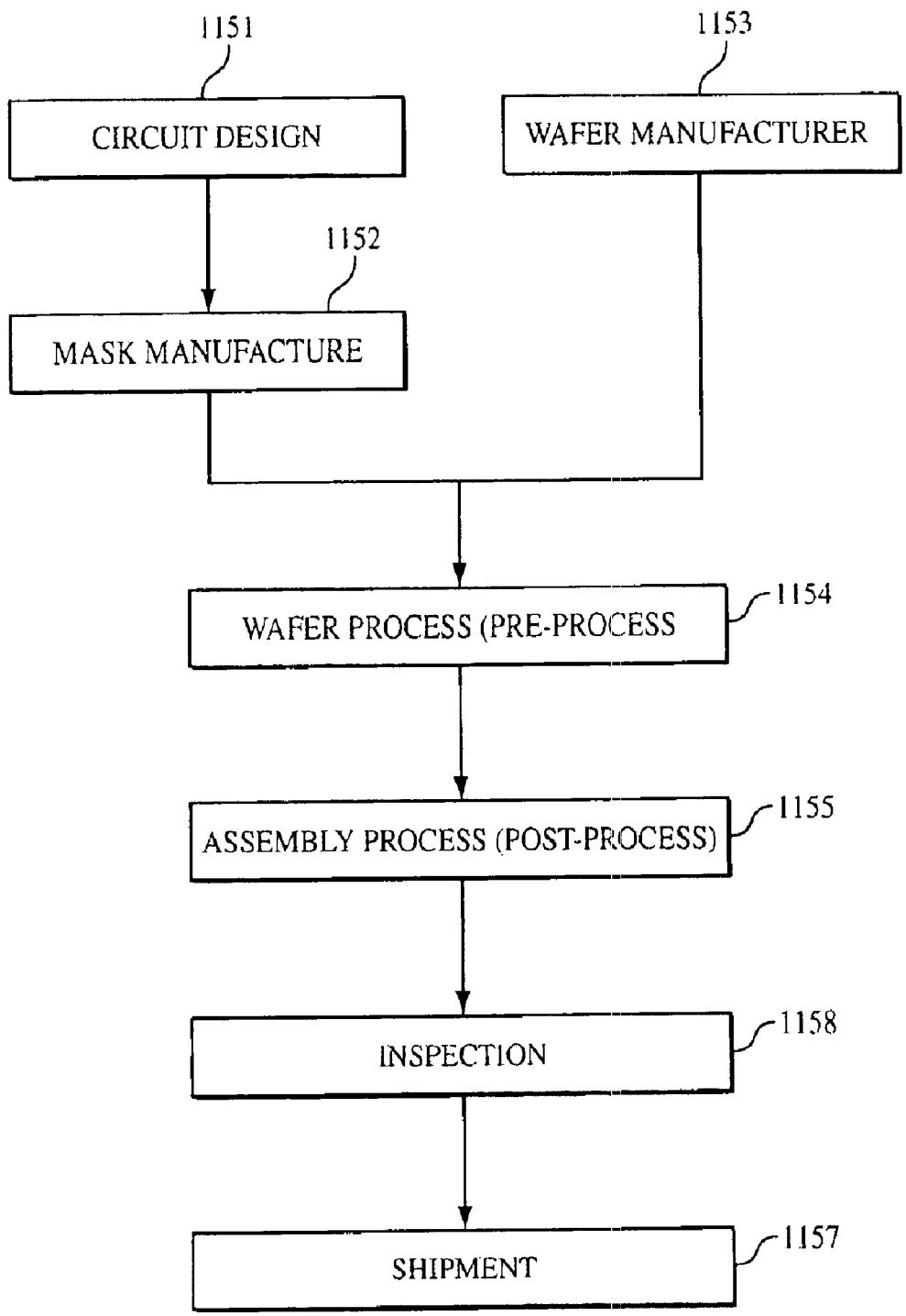

FIG. 4c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. As described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a * resist separation process for separating the resist material remaining on the wafer after being subjected to the etching process. By repeating these processes, circuit patterns are formed and superimposed on the wafer.

The interferometric stage systems described above can also be used in other applications in which the relative position of an object needs to be measured precisely, and where an alignment initialization is important. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 5:
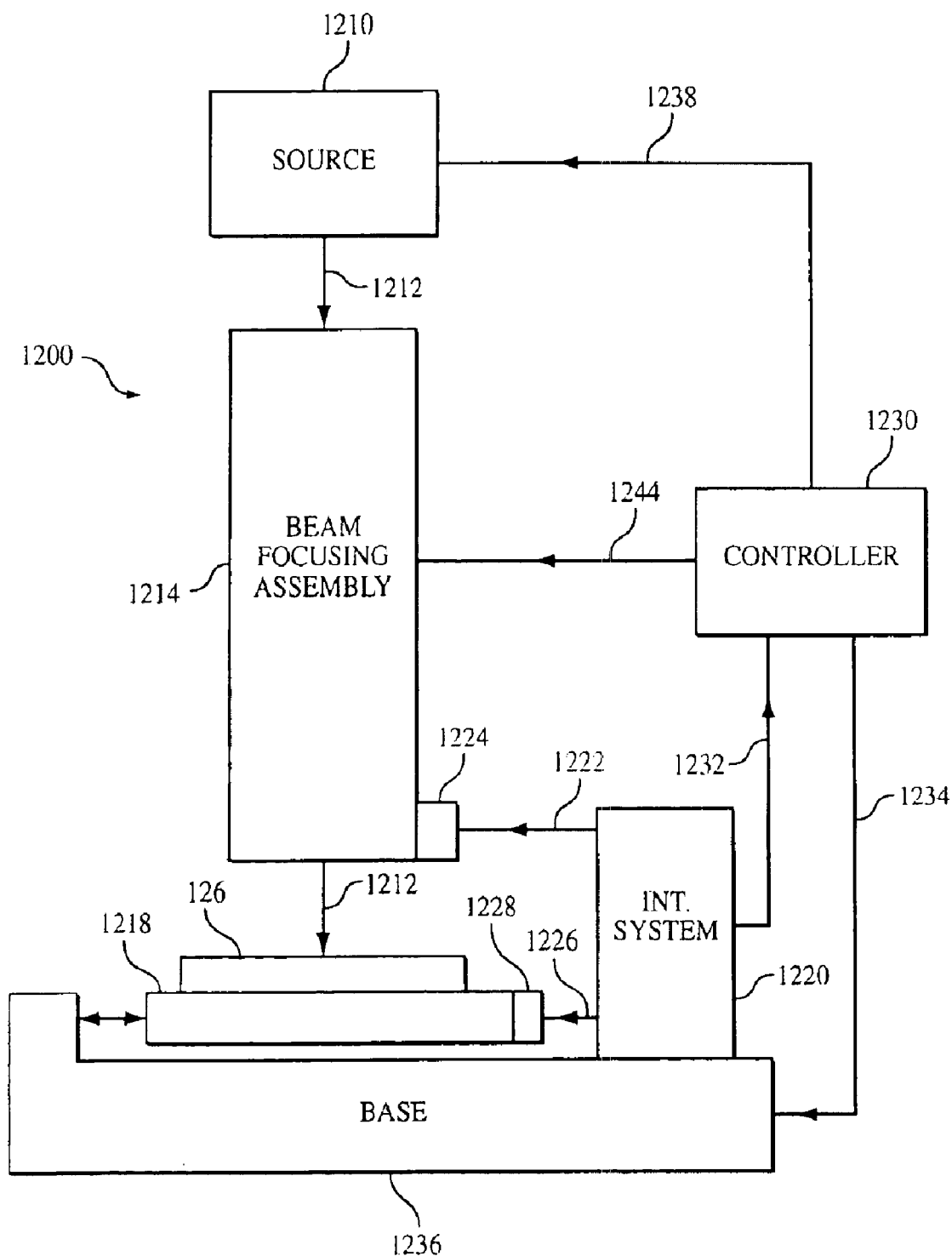
FIG. 5 is a schematic of a beam writing system.

As an example, a schematic of a beam writing system 1200 is shown in FIG. 5. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 and associated electronic processing can be that described above for more accurately making average position and angle measurements. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An interferometric stage system comprising:

a translatable stage;

a base defining a reference frame;

a positioning system coupled to the stage for adjusting the position of the stage relative to the reference frame;

an interferometry system which during operation directs a measurement beam along a first path between the stage and a portion of the base to produce an interferometric signal indicative of a position of the stage along the path, wherein a defect in the interferometry system produces a cyclic error contribution to the interferometric signal; and an electronic controller coupled to the interferometry system and the positioning system, wherein during operation the electronic controller determines an average position for the stage along the first path based on the interferometric signal corresponding to each of multiple positions of the stage, wherein the multiple positions of the stage include an initial position and at least one additional position, and wherein the controller selects each of the additional positions to reduce the cyclic error contribution in the average position.

2. The system of claim 1, wherein during operation the electronic controller causes the positioning system to translate the stage to each of the additional positions.

3. The system of claim 1, wherein the interferometric signal for a particular position of the stage can be expressed by a measured phase φ, where $$\tilde{\varphi} = \varphi + \sum_{m=1,p=1} \varepsilon_{m,p} \sin\left(\frac{m\varphi}{p} + \delta_{m,p}\right),$$

and where φ is linearly proportional to the position of the stage and the remaining terms represent the cyclic error contribution with specific cyclic errors indexed by positive integers m and p, and wherein at least one of the additional positions selected by the electronic controller corresponds to $\phi=\phi_0+(\pi+2\pi n)p/m$ for some integer n, where the initial position corresponds to $\phi=\phi_0$.

4. The system of claim 3, wherein the m=1, p=1 cyclic error term is the dominant term in the cyclic error contribution and wherein the at least one additional position selected by the electronic controller consists of one additional position corresponding to the measured phase $\phi_1 = \phi_0+\pi+2\pi n_1$, wherein $n_1=1$.

5. The system of claim 3, wherein the m=1, p=2 cyclic error term is the dominant term in the cyclic error contribution and wherein the at least one additional position selected by the electronic controller consists of one additional position corresponding to the measured phase $\phi_1 = \phi_0+2\pi+4\pi n_1$, wherein $n_1=1$.

6. The system of claim 3, wherein the m=2, p=1 cyclic error term is the dominant term in the cyclic error contribution and wherein the at least one additional position selected by the electronic controller consists of one additional position corresponding the measured phase $\phi_1 = \phi_0+\pi/2+\pi n_1$, wherein $n_1=1$.

7. The system of claim 3, wherein the additional positions selected by the electronic controller comprise positions corresponding to the measured phases $\phi_0+\pi+4\pi n_1$, $\phi_0+2\pi+4\pi n_2$, and $\phi_0+3\pi+4\pi n_3$, for integers $n_1$, $n_2$, and $n_3$.

8. The system of claim 3, wherein the additional positions selected by the electronic controller comprise positions corresponding to the measured phases $\phi_0+\pi/2+2\pi n_1$, $\phi_0+\pi+2\pi n_2$, and $\phi_0+3\pi/2+2\pi n_3$, for integers $n_1$, $n_2$, and $n_3$.

9. The system of claim 3, wherein the additional positions selected by the electronic controller comprise positions corresponding to the measured phases $\phi_0+\pi/2+4\pi n_1$, $\phi_0+\pi+4\pi n_2$, $\phi_0+3\pi/2+4\pi n_3$, $\phi_0+2\pi+4\pi n_4$, $\phi_0+5\pi/2+4\pi n_5$, $\phi_0+3\pi+4\pi n_6$, and $\phi_0+7\pi/2+4\pi n_7$, for integers $n_1$, $n_2$, $n_3$, $n_4$, $n_5$, $n_6$, and $n_7$.

10. The system of claim 3, wherein the average position is linearly proportional to the average of the measured phases corresponding to the multiple positions.

11. The system of claim 1, wherein the electronic controller determines the average position by applying a digital filter to the interferometric signals corresponding to the multiple positions.

12. The system of claim 1, further comprising an alignment scope coupled to the electronic controller, wherein during operation the electronic controller determines whether an alignment mark on a wafer carried by the stage is within view of the alignment scope, and wherein the initial positions and the additional positions selected by the electronic controller are positions in which the alignment mark is within the view of the alignment scope.

13. The system of claim 1, wherein during operation the electronic controller determines a second average position of the stage corresponding to a second set of multiple positions of the stage, and wherein the electronic controller further determines a speed for the stage based on the first-mentioned average position and the second average position.

14. The system of claim 1, wherein during operation the interferometry system directs a second measurement beam along a second path between the stage and the portion of the base to produce a second interferometric signal indicative of a position of the stage along the second path.

15. The system of claim 14, wherein the interferometry system comprises two separate interferometers, the first interferometer directing the first measurement beam and the second interferometer directing the second measurement beam.

16. The system of claim 14, wherein the interferometry system comprises a multi-axis interferometer providing measurement axes along the first and second paths.

17. The system of claim 14, wherein during operation the electronic controller determines an average position of the stage along the second path based on the second interferometric signal corresponding to each of the multiple positions of the stage.

18. The system of claim 17, wherein the first and second paths are parallel to one another.

19. The system of claim 18, wherein during operation the electronic controller determines an angular orientation for the stage based on the average position of the stage along the first path and the average position of the stage along the second path.

20. The system of claim 19, wherein translation of the stage to each of the additional positions causes the first and second interferometric signals to change by the same amount relative to the first and second interferometric signals for the initial position.

21. The system of claim 19, further comprising an alignment scope coupled to the electronic controller, wherein during operation the electronic controller determines whether an alignment mark on a wafer carried by the stage is within view of the alignment scope, and wherein the initial position and the additional positions selected by the electronic controller are positions in which the alignment mark is within the view of the alignment scope.

22. The system of claim 21, wherein the electronic controller further determines an Abbe offset error for the alignment mark based on the angular orientation determined by the processor and an off-set distance corresponding to a lateral displacement between the alignment mark and the first measurement beam path.

23. The system of claim 1, wherein the interferometry system comprises an interferometer secured to the portion of the base and a measurement object secured to the stage, wherein during operation the interferometer directs the measurement beam to reflect from the measurement object.

24. The system of claim 1, wherein the interferometry system comprises an interferometer secured to the stage and a measurement object secured to the portion of the base, wherein during operation the interferometer directs the measurement beam to reflect from the measurement object.

25. The system of claim 1, wherein during operation the interferometry system directs the measurement beam to pass between the stage and the portion of the base more than once.

26. An interferometric method comprising:
generating an interferometric signal for each of multiple positions of the stage, wherein the interferometric signal indicates the stage position along a first path and wherein the multiple positions of the stage include an initial position and at least one additional position;
determining an average position for the stage based on the interferometric signal corresponding to each of multiple positions; and selecting the at least one additional position to reduce a cyclic error contribution from the interferometric signal in the average position.

27. The method of claim 26, wherein the interferometric signal for a particular position of the stage can be expressed by a measured phase $\tilde{\varphi}$, where $$\tilde{\varphi} = \varphi + \sum_{m=1,p=1} \varepsilon_{m,p} \sin\left(\frac{m\varphi}{p} + \delta_{m,p}\right),$$

and where $\phi$ is linearly proportional to the position of the stage and the remaining terms represent the cyclic error contribution with specific cyclic errors indexed by positive integers m and p, and wherein at least one of the selected additional positions corresponds to $\phi = \phi_0 + (\pi + 2\pi n)$ p/m for some integer n, where the initial position corresponds to $\phi = \phi_0$.

28. The method of claim 27, wherein the m=1, p=1 cyclic error term is the dominant term in the cyclic error contribution and wherein the at least one selected additional position consists of one additional position corresponding to the measured phase $\phi_1 = \phi_0 + \pi + 2\pi n_1$, wherein $n_1 = 1$.

29. The method of claim 27, wherein the m=1, p=2 cyclic error term is the dominant term in the cyclic error contribution and wherein the at least one selected additional position consists of one additional position corresponding to the measured phase $\phi_1 = \phi_0 + 2\pi + 4\pi n_1$, wherein $n_1 = 1$.

30. The method of claim 27, wherein the m=2, p=1 cyclic error term is the dominant term in the cyclic error contribution and wherein the at least one selected additional position consists of one additional position corresponding to the measured phase $\phi_1 = \phi_0 + \pi/2 + \pi n_1$, wherein $n_1 1$.

31. The method of claim 27, wherein the selected additional positions comprise positions corresponding to the measured phases $\phi_0 + \pi + 4\pi n_1$, $\phi_0 + 2\pi + 4\pi n_2$, and $\phi_0 + 3\pi + 4\pi n_3$, for integers $n_1$, $n_2$, and $n_3$.

32. The method of claim 27, wherein the selected additional positions comprise positions corresponding to the measured phases $\phi_0 + \pi/2 + 2\pi n_1$, $\phi_0 + \pi + 2\pi n_2$, and $\phi_0 + 3\pi/2 + 2\pi n_3$, for integers $n_1$, $n_2$, and $n_3$.

33. The method of claim 27, wherein the selected additional positions comprise positions corresponding to the measured phases $\phi_0 + \pi/2 + 4\pi n_1$, $\phi_0 + \pi + 4\pi n_2$, $\phi_0 + 3\pi/2 + 4\pi n_3$, $\phi_0 + 2\pi + 4\pi n_4$, $\phi_0 + 5\pi/2 + 4\pi n_5$, $\phi_0 + 3\pi + 4\pi n_6$, and $\phi_0 + 7\pi/2 + 4\pi n_7$, for integers $n_1$, $n_2$, $n_3$, $n_4$, $n_5$, $n_6$, and $n_7$.

34. The method of claim 27, wherein determining the average position comprises averaging the measured phases corresponding to the additional positions.

35. The method of claim 34, wherein averaging the measured phases comprises applying a digital filter to the interferometric signals corresponding to the multiple positions.

36. The method of claim 26, further comprising determining whether an alignment mark on a wafer carried by the stage is within view of an alignment scope, and wherein the initial position and the selected additional positions are positions in which the alignment mark is within the view of the alignment scope.

37. The method of claim 26, further comprising:

determining a second average position of the stage corresponding to a second set of multiple positions of the stage, and determining a speed for the stage based on the first-mentioned average position and the second average position.

38. The method of claim 26, further comprising:

generating a second interferometric signal for each of the multiple positions, wherein the second interferometric signal is indicative of the stage position along a second path; and determining an average position of the stage along the second path based on the second interferometric signals.

39. The method of claim 38, wherein the first and second paths are parallel to one another.

40. The method of claim 38, further comprising determining an angular orientation for the stage based on the average position of the stage along the first path and the average position of the stage along the second path.

41. The method of claim 40, wherein translation of the stage to each of the additional positions causes the first and second interferometric signals to change by the same amount relative to the first and second interferometric signals for the initial position.

42. The method of claim 40, further comprising determining whether an alignment mark on a wafer carried by the stage is within view of an alignment scope, and wherein the initial position and the selected additional positions are positions in which the alignment mark is within the view of the alignment scope.

43. The method of claim 42, further comprising determining an Abbe offset error for the alignment mark based on the angular orientation and an off-set distance corresponding to a lateral displacement between the alignment mark and the first path.

* * * * *

UNITED STATES PATENT AND TRADEMARK OFFICE
CERTIFICATE OF CORRECTION

PATENT NO. : 6,891,624 B2
DATED : May 10, 2005
INVENTOR(S) : Henry A. Hill

It is certified that error appears in the above-identified patent and that said Letters Patent is hereby corrected as shown below:

Column 5,

Lines 2 and 7, replace "ϕ" with -- ■ --.

Line 12, replace "ϕ=ϕ" with -- ■ --.

Line 13, replace "ϕ=ϕ₀" with -- ■ --.

Lines 18, 23 and 29, replace "ϕ₁=ϕ₀" with -- ■ --.
Lines 36 (3 occurrences), 41 (2 occurrences), 42, 46, 47 (4 occurrences) and 48 (2 occurrences), replace "ϕ₀" with -- ■ --.

Column 7,

Lines 2, 8 and 13, replace "ϕ" with -- ■ --.

Line 12, replace "ϕ=ϕ₀" with -- ■ --.
Lines 14, 34 (2 occurrences), 35 (2 occurrences), 39 (3 occurrences), 44 (3 occurrences), 45 (3 occurrences) and 46, replace "ϕ₀" with -- ■ --.

Line 18, replace "ϕ₁" with -- ■ --.
Line 19, replace "ϕ₀" with -- $\tilde{\varphi}_0$ --.
Lines 24 and 29, replace "ϕ₁=ϕ₀" with -- ■ --.

Column 10,

Lines 11, 13, 22, 26 and 46, replace "ϕ" with -- ■ --.

Line 28, replace "ϕ=ϕ+ψ" with -- ■ --.
Lines 30, 32, 34 and 35, replace "ϕ" with -- $\varphi$ --.

Column 11,

Line 6, replace "ϕ=ϕ+ε₁,₁ sin(ϕ+δ₁,₁)" with -- ■ --.
Line 9, replace "ϕ≡ϕ₀" with -- $\varphi \equiv \varphi_0$ --.
Lines 10 and 26, replace "ϕ≡ϕ₁=ϕ₀+π" with -- $\varphi \equiv \varphi_1 = \varphi_0 + \pi$ --.

Lines 29 and 31, replace "ϕ" with -- ■ --.

Line 39, replace "ϕ≡ϕ(ϕ₀)= ϕ₀" with -- ■ --.

UNITED STATES PATENT AND TRADEMARK OFFICE
CERTIFICATE OF CORRECTION

PATENT NO. : 6,891,624 B2
DATED : May 10, 2005
INVENTOR(S) : Henry A. Hill

It is certified that error appears in the above-identified patent and that said Letters Patent is hereby corrected as shown below:

Column 11 (cont'd),

Lines 41 and 42, replace "$\phi \equiv \phi_1 = \phi_0 + \pi$" with -- ▮ --.
Line 54, replace "$\phi = \phi + \varepsilon_{1,1} \sin(\phi + \delta_{1,1}) + o(\varepsilon_{1,1}^2)$" with
-- ▮ --.

Column 12,

Lines 17 and 31, replace "$\phi_0$" with -- ▮ --.
Line 18, replace "$\phi_1 = \phi_0 + \pi, \phi_2 = \phi_0 + 2\pi,$ and $\phi_3 = \phi_0 + 3\pi$" with
-- ▮ --.
Lines 32, 33 and 34, replace "$\phi_1 = \phi_0 + \pi/2, \phi_2 = \phi_0 + \pi, \phi_3 = \phi_0 + 3\pi/2, \phi_4 = \phi_0 + 2\pi, \phi_5 = \phi_0 + 5\pi/2, \phi_6 = \phi_0 + 3\pi,$ and $\phi_7 = \phi_0 + 7\pi/2$" with
-- ▮ --.

Lines 64 and 66, replace "$\phi$" with -- ▮ --.

Column 14,

Line 42, replace "$\phi_1$" with -- ▮ --.
Line 43, replace "$\phi_2$" with -- $\tilde{\varphi}_2$ --.
Line 45, replace "$\phi_1$ and $\phi_2$" with -- ▮ --.
Lines 49 and 58, replace "$\theta$" with -- $\vartheta$ --.

Column 15,
Lines 1 and 7, replace "$\theta_\Psi$" with -- $\vartheta_\Psi$ --.
Lines 24, 29, 30 and 32, replace "$\theta$" with -- $\vartheta$ --.
Line 25, replace "$(\phi_1$ and $(\phi_2$" with -- ▮ --.
Line 27, replace "$\phi_1$ and $\phi_2$" with -- ▮ --.
Line 39, replace "$\theta^{(0)}$" with -- $\vartheta^{(0)}$ --.

Lines 41 and 42, replace "$(\phi_1 \equiv \phi_1^{(0)}, \phi_2 \equiv \phi_2^{(0)})$" with -- ▮ --.
Line 44, replace "$\theta^{(0)}$" with -- $\vartheta^{(1)}$ --.

UNITED STATES PATENT AND TRADEMARK OFFICE
CERTIFICATE OF CORRECTION

PATENT NO. : 6,891,624 B2  Page 3 of 3
DATED : May 10, 2005
INVENTOR(S) : Henry A. Hill It is certified that error appears in the above-identified patent and that said Letters Patent is hereby corrected as shown below:

Column 15 (cont'd),
Lines 45 and 46, replace "$((\phi_1 \equiv \phi_1^{(0)} + \pi, \phi_2 \equiv \phi_2^{(0)} + \pi))$" with -- ■ --.

Column 21,

Lines 3 and 7, replace "$\phi$" with -- ■ --.

Lines 12 and 13, replace "$\phi = \phi_0$" with -- $\widetilde{\varphi} = \widetilde{\varphi}_0$ --.

Lines 18, 24 and 30, replace "$\phi_1$" with -- ■ --.
Lines 19, 25, 31, 34, 35 (2 occurrences), 38, 39 (2 occurrences), 42, 43 (4 occurrences) and 44 (2 occurrences), replace "$\phi_0$" with -- ■ --.

Column 23,

Lines 6, 10 and 15, replace "$\phi$" with -- ■ --.

Line 14, replace "$\phi = \phi_0$" with -- ■ --.
Lines 16, 34 (2 occurrences), 35, 38 (2 occurrences), 39, 42 (3 occurrences), 43 (3 occurrences) and 44, replace "$\phi_0$" with -- ■ --.

Line 21, replace "$\phi_1$" with -- ■ --.

Lines 26 and 31, replace "$\phi_1 = \phi_0$" with -- ■ --.

Signed and Sealed this

Thirteenth Day of June, 2006

JON W. DUDAS
*Director of the United States Patent and Trademark Office*